United States Patent [19]
Lao et al.

[11] Patent Number: 5,329,155
[45] Date of Patent: Jul. 12, 1994

[54] THIN FILM INTEGRATED CIRCUIT RESISTOR

[75] Inventors: Guillermo Lao, Hawthorne; Dale Sumida, Los Angeles; Anh K. Hoang-Le, Huntington Park; Mohamad Mojaradi, Los Angeles; Tuan A. Vo, Hawthorne, all of Calif.

[73] Assignee: Xerox Corporation, Stamford, Conn.

[21] Appl. No.: 513,697

[22] Filed: Apr. 24, 1990

[51] Int. Cl.⁵ .................. H01L 27/01; H01L 23/64; H01C 1/06
[52] U.S. Cl. .................. 257/538; 257/540; 257/67; 257/630; 257/659
[58] Field of Search .............. 257/538, 540, 67, 630, 257/659

[56] References Cited

U.S. PATENT DOCUMENTS

| | | | |
|---|---|---|---|
| 4,164,668 | 8/1979 | Delaporte et al. | 357/51 |
| 4,326,213 | 4/1982 | Shirai et al. | 357/59 F |
| 4,455,567 | 6/1984 | Lee et al. | 357/51 |
| 4,553,125 | 11/1985 | Sugawara | 338/283 |
| 4,626,889 | 12/1986 | Yamamoto et al. | 357/51 |
| 4,926,243 | 5/1990 | Nakagawa et al. | 357/84 |

Primary Examiner—William D. Larkins
Attorney, Agent, or Firm—Dan O'Neil

[57] ABSTRACT

A thin film integrated circuit resistor is disclosed that is substantially linear at applied voltages greater than 100 volts. The integrated circuit resistor comprises a substrate, a plurality of resistive blocks electrically connected in series, a shield associated with each resistive block, and passivation means for isolating the substrate from the resistive blocks and the shields, and for isolating the shields from the resistive blocks except where they are electrically connected. Each shield substantially surrounds its associated resistive block with conductive material, and each shield is electrically connected to its resistive block such that each shield is at a potential of some point along the length of its associated resistive block.

4 Claims, 5 Drawing Sheets

THIN FILM INTEGRATED CIRCUIT RESISTOR

FIELD OF THE INVENTION

This invention relates to a thin film integrated circuit resistor, and more particularly to such a resistor that remains substantially linear across a range of applied voltages generally greater than 100 volts.

BACKGROUND OF THE INVENTION

A typical thin film integrated circuit resistor consists of a resistive block of polysilicon with a low sheet resistance (e.g., less than 1000 ohms per square). The resistive block is fabricated above a major surface of a semiconductor substrate, along with other components of an integrated circuit, and separated from the substrate by a passivation layer. The substrate typically is doped to be conductive, and it is connected to either the most positive or the most negative potential, depending on whether it was doped with p-type or n-type impurities, respectively The typical thin film integrated circuit resistor is substantially linear for applied voltages less than 100 volts. For applied voltages greater than 100 volts, however, the typical resistor is subject to breakdown, and to nonlinearity. The nonlinearity is due to effects on the charge carrier density within the resistive block. The charge carrier density is affected by electric fields associated with potential differences between regions of the resistive block and the substrate (substrate bias voltages).

In some high voltage applications, the linearity of a thin film integrated circuit resistor is not important. Resistor linearity, however, is of great consequence in analog applications, such as high voltage sensors, precision current to voltage converters, and digital to analog converters. Moreover, resistor linearity is a particular concern in analog applications that use resistive blocks having a relatively high sheet resistance (e.g., over 1000 ohms per square), since the effects of a given substrate bias voltage electric field on charge carrier density with increasing sheet resistance.

There is therefore a need for a thin film integrated circuit resistor that is substantially linear at applied voltages greater than 100 volts.

SUMMARY OF THE INVENTION

The present invention provides a thin film integrated circuit resistor that is substantially linear for voltages greater than 100 volts. In accordance with the invention, the thin film integrated circuit resistor comprises a substrate, a plurality of resistive blocks that are electrically connected in series, a shield associated with each resistive block, and passivation means for isolating the substrate from the resistive blocks and their associated shields, and for isolating the shields from the resistive blocks except where they are electrically connected. Each shield substantially surrounds its associated resistive block with conductive material, and each shield is electrically connected to its resistive block such that each shield is at a potential of some point along the length of its associated resistive block.

Since each shield substantially surrounds its associated resistive block with conductive material having the potential of some point along the length of its associated resistive block, the charge carrier densities within the resistive blocks are not subject to electric fields associated with the bias voltages of substrate (the substrate bias voltages). Rather, the charge carrier densities are only subject to electric fields associated with potential differences between each shield and its associated resistive block (shield bias voltages). The shield bias voltage is at most the voltage drop across a resistive block. Since there are a plurality of resistive blocks, the maximum shield bias voltage is only a fraction of the voltage applied across the resistor. Without the shields, substrate bias voltages could be as great as (or greater than) the voltage applied across the resistor.

In accordance with one aspect of the invention, each shield is electrically connected to the back end of its associated resistive block, so that the potential of each shield is the potential at the back end of its resistive block. This embodiment provides the optimal linearity where the voltage across the resistor is a single polarity and the front end of the resistor is at a greater potential than the back end. In accordance with another aspect of the invention, each shield is electrically connected to the point along the length of its associated resistive block that is the potential of the midpoint of the potential difference between ends of its resistive block, so that the potential of each shield is this midpoint potential. This embodiment provides the optimal linearity where the voltage applied across the resistor varies in polarity.

Other aspects of the invention will become apparent from the following description with reference to the drawings, wherein:

DETAILED DESCRIPTION OF THE PREFERRED EMBODIMENTS

Figure 1:
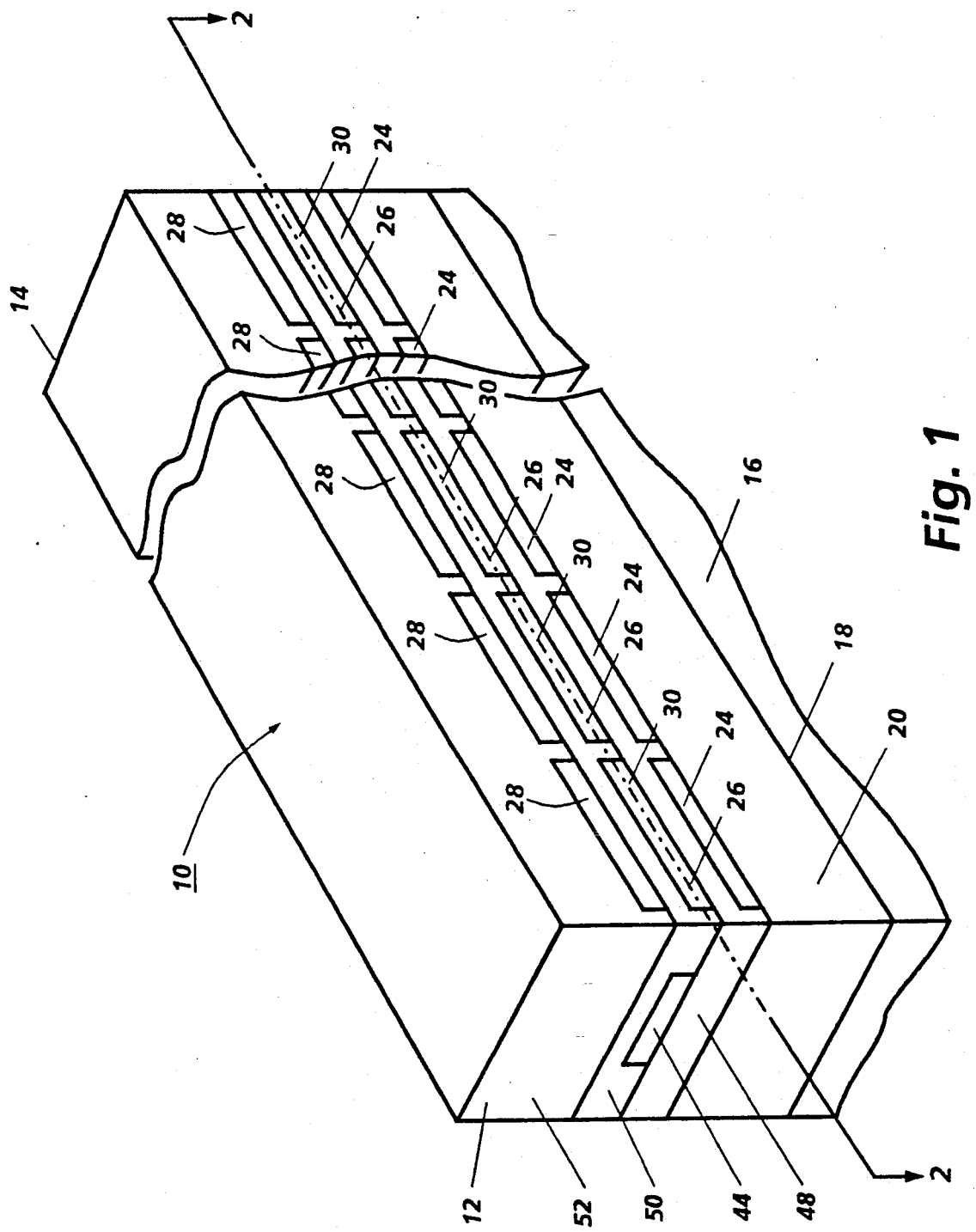
FIG. 1 is an perspective view of a thin film integrated circuit resistor produced in accordance with the present invention.

In FIGS. 1-4 there is shown a thin film integrated circuit resistor 10 embodying the invention. As shown in FIG. 1, the resistor 10 is a component of an integrated circuit (not shown) and is connected by standard means to other circuit components (not shown) at its front and back ends 12 and 14, respectively. The resistor 10 comprises a conductive silicon substrate 16 having a major surface 18 and a passivation layer 20 which consists of silicon dioxide. This silicon dioxide can be grown from the major surface 18 below it, deposited on the major surface 18, or both grown from and deposited on the major surface 18. A plurality of resistor blocks 22 (FIGS. 2-4) are positioned above the passivation layer 20. The resistive blocks 22 are uniform in shape, size, composition and resistance to simplify their design and fabrication.

Figure 2:
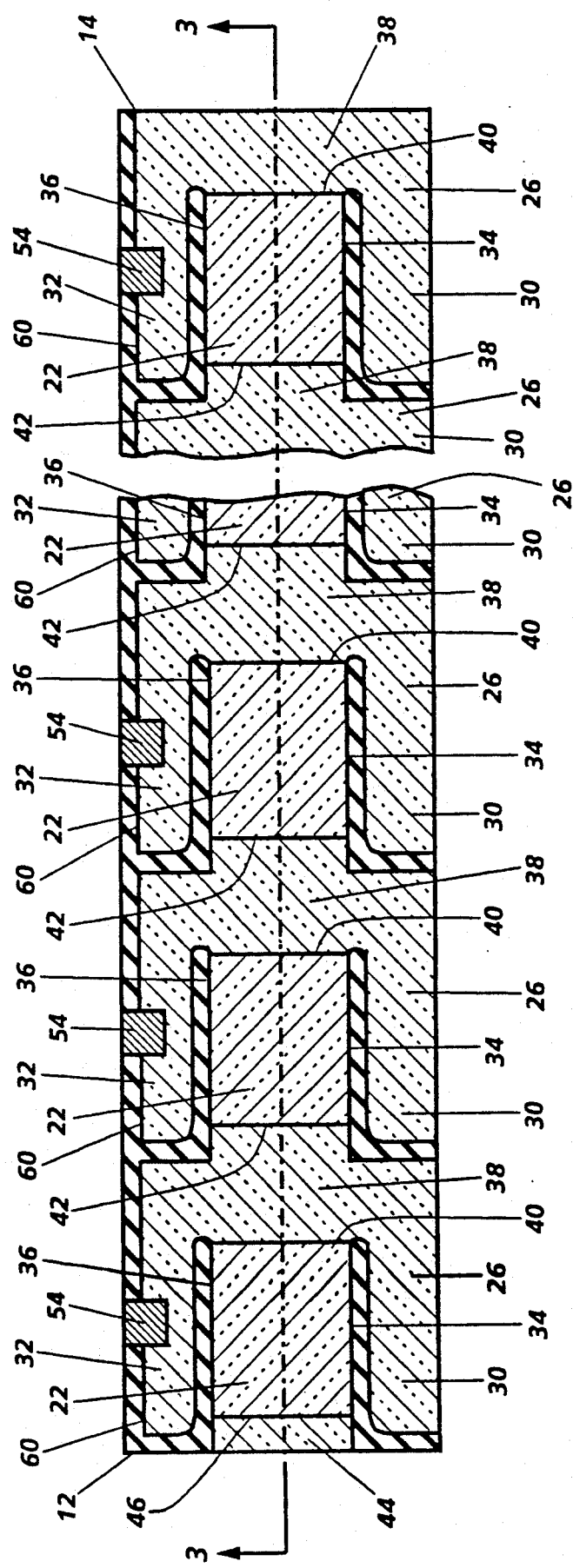
FIG. 2 is a view of a thin film integrated circuit resistor taken along section line 2—2 of FIG. 1.
Figure 3:
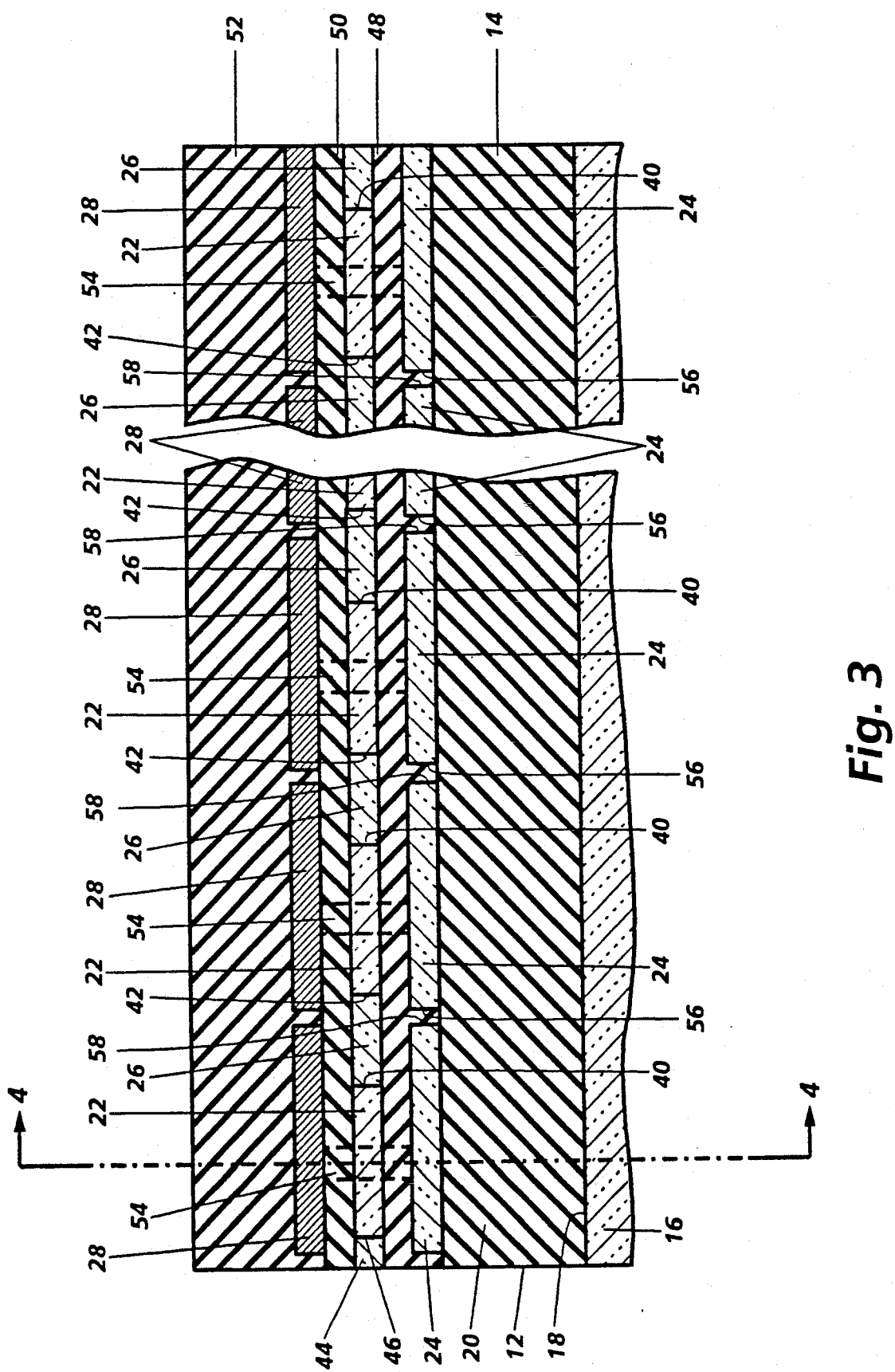
FIG. 3 is a view taken along section line 3—3 of FIG. 2.
Figure 4:
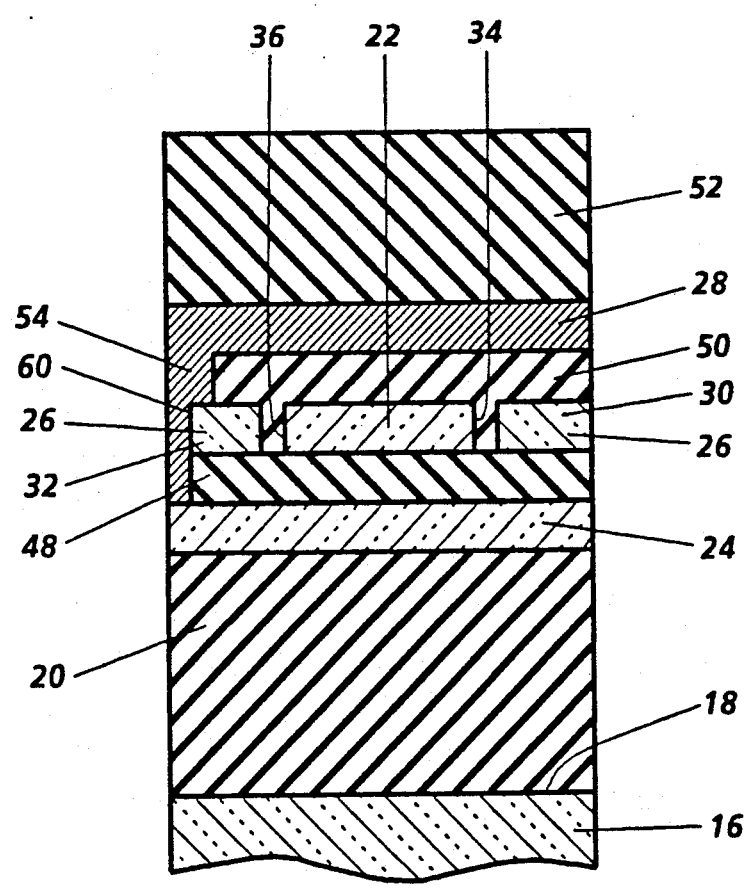
FIG. 4 is a view taken along section line 4—4 of FIG. 3.

Referring to FIGS. 2-4, each resistive block 22 has an associated shield substantially surrounding it that consists of a bottom plate 24, a middle plate 26, and a top plate 28. The resistive blocks 22 and their associated shields are arranged in proximity, end to end. The plates 24, 26 and 28 of the shields are conductive. Each shield and its associated resistive block 22 are arranged such that the bottom plate 24 is below the resistive block 22, the middle plate 26 and the top plate 28. The top plate 28 is above the resistive block 22, the middle plate 26 and the bottom plate 24. The middle plate 26 is coplanar with the resistive block 22 and located between the bottom plate 24 and the top plate 28.

Referring to FIG. 2, the middle plate 26 is generally U-shaped with a pair of legs 30 and 32 that straddle and are spaced from the side edges 34 and 36, respectively, of its associated resistive block 22. The portion 38 of the middle plate 26 between the legs 30 and 32 contacts the rear edge 40 of the resistive block 22 and engages the front edge 42 of its adjacent resistive block 22 to form a series electrical connection between the resistive blocks 22.

Since there is no middle plate 26 in front of the front most resistive block 22, a middle plate 44 is provided to shield the front edge 46 of the front most resistive block 22. This middle plate 44 is coplanar with the middle plate 26 and contacts the front most resistive block 22 at its front edge 46.

Referring to FIGS. 3 and 4, each bottom plate 24 and top plate 28 is of an area large enough to extend beyond all edges 34, 36, 40 and 42 (46) of the resistive block 22 associated with it. In this manner, the top and bottom plates 24 and 28 more effectively shield their associated resistive blocks 22.

Referring to FIG. 3, each bottom plate 24 is isolated from its associated resistive block 22 by a passivation layer 48, which is positioned between the bottom plate 24 and its resistive block 22. Each top plate 28 is isolated from its resistive block 22 by a passivation layer 50, which is positioned between the top plate 28 and its resistive block 22. A final passivation layer 52 is positioned above and in contact with the top plates 28 and serves not only to electrically insulate the underlying structure, but to protect it mechanically as well.

Referring to FIGS. 2 and 4, the plates 24, 26, and 28 of each shield are electrically connected to each other by means of a plate connector 54, which is integral with the plate 28 and is in contact with the plates 24 and 26. The plate connector 54 is conductive, and it passes through the passivation layers 50 and 48, and through a portion of the polysilicon that is alongside the leg 32. Since the plate connectors 54 electrically connect their associated plates 24, 26, and 28, and the middle plates 26 are electrically connected to the back end 40 of their associated resistive blocks 22, the potential of each shield is the potential at the back end 40 of its associated resistive block 22.

The resistor 10, described above, will remain substantially linear across an applied voltage range of from 0 to over 1400 volts. This is shown in an exemplary example of a 7.5 megohm resistor. The 7.5 megohm resistor includes 1500 resistive blocks 22 and 1500 shields. The substrate 16 is doped with p-type impurities and is connected at the most negative potential of the integrated circuit (not shown). The resistive blocks 22, which are electrically connected in series, each have a sheet resistance of 10 kilohms per square, and a resistance of 5.0 kilohms to produce the 7.5 megohm resistor.

Since each shield substantially surrounds its associated resistive block 22 with conductive material at one of the potentials along the length of its associated resistive block 22 (e.g., at the potential at the back end 40 of its associated resistive block 22), the charge carrier densities within the resistive blocks 22 are not subject to electric fields associated with the bias voltages of substrate 16 (the substrate bias voltages). Rather, the charge carrier densities are only subject to electric fields associated with potential differences between each shield and its associated resistive block 22 (shield bias voltages). The maximum bias voltage between any shield and its associated resistive block 22 is the voltage drop across a resistive block 22, or 1/1500th of the voltage applied across the resistor 10. Without the shields, substrate bias voltages could be as great as (or greater than) the voltage applied across the resistor 10, or 1500 times the value of the maximum shield bias voltage.

In this particular example, resistor 10 is particularly suited for high voltage analog applications: The passivation layer 20 is a relatively thick 3.5 microns to achieve a breakdown voltage of approximately 2000 volts, and the resistance of the resistor 10 varies less than ±1% across a range of applied voltage from 0 to over 1400 volts. In addition, the area of major surface 18 occupied by 7.5 megohm resistor 10 is minimized by constructing resistive blocks 22 from a material with a sheet resistance of 10 kilohms per square, which is a high value compared to the sheet resistance of a typical thin film integrated circuit resistor (e.g., less than 100 ohms per square).

Although in this particular example resistor 10 is particularly suited for high voltage analog applications, it would be known to one skilled in the art to design resistor 10 to other specifications for other applications. For example, resistor 10 could be designed to operate over a voltage range that is greater than from 0 to 1400 volts (e.g., 0 to 1600 volts), and to vary in its resistance over the voltage range by an amount greater or lesser than ±1% (e.g., ±10% or ±0.1%, respectively).

In particular, it would be known to one skilled in the art to design resistor 10 with a different number of pairs of shields and their respective resistive blocks 22. For example, constructing resistor 10 using more than 1500 pairs of shields and their associated resistive blocks 22 (e.g., 2000 shields and their associated resistive blocks 22) would have the beneficial effect of decreasing the maximum shield bias voltage (e.g., from 1/1500 of the maximum substrate bias voltage to 1/2000 of the maximum substrate bias voltage).

The bottom plate 24 is the most important plate for shielding its associated resistive block 22 from substrate bias voltage electric fields. This is because the bottom plates 24 are positioned directly between their associated resistive blocks 22 and the major surface 18 of the substrate 16.

Referring now to FIG. 3, resistor 10 is fabricated using conventional MOS processes. In the first step a 3.5 micron thick layer of silicon dioxide is formed through thermal growth, deposition, or some combination of these techniques, to create passivation layer 20. Next a 0.4 micron thick layer of polysilicon is deposited on the passivation layer 20, doped with n-type impurities, then patterned and etched to form the individual bottom plates 24 with gaps formed between adjacent front and rear ends 56 and 58, respectively, of the bottom plates 24. The doping is in a concentration sufficient to make the polysilicon conductive. A 0.4 micron thick layer of silicon dioxide is then grown on top of the bottom plates 24 to form passivation layer 48. The silicon dioxide also grows in the gaps between adjacent bottom plates 24, thereby electrically insulating adjacent bottom plates 24 from each other.

Next a 0.4 micron thick layer of polysilicon is deposited on the passivation layer 48, then patterned, etched and selectively doped with n-type impurities to make the resistive blocks 22, the middle plates 26, and the middle plate 44. The etching creates gaps between the side edges 34 and 36 of the resistive blocks 22 and the legs 32 and 30 of its associated middle plate 26, respectively. Furthermore, the etching creates a gap between the rear portions of the legs 30 and 32 of each of the middle plates 26 and the adjacent front portions of the legs 30 and 32 of the next rear adjacent middle plate 26. The doping of the middle plates 26 and 44 consists of n-type impurities in a quantity sufficient to make the polysilicon conductive. In this example, the doping of the resistive blocks 22 consists of n-type impurities in a concentration of 2.7 E 14 per square, which is low enough to yield a sheet resistance of 10 kilohms per square, or 5 kilohms for each of the 1500 resistive blocks 22.

A 0.4 micron thick layer of silicon dioxide is then grown on top of the resistive blocks 22 and middle plates 26 and 44 to form passivation layer 50. The silicon dioxide also grows alongside outside edge 60 of legs 32, in the gaps between adjacent middle plates 26, and in the gaps between the arms 30 and 32 of a middle plate 26 and the sides 36 and 34 of its associated resistive block 22, respectively. The silicon dioxide grown in these gaps serves to electrically insulate the various members from each other, except where they are electrically connected.

Referring to FIG. 4, the plate connectors 54 are formed by first etching apertures in passivation layers 48 and 50, and in portions of the silicon dioxide alongside the legs 32 to expose a portion of the top surface of the legs 32 along the edge 60 and a portion of the top surface of the bottom plates 24. The apertures pass alongside the polysilicon legs 32, rather than through them, since the apertures are etched using conventional etching techniques, such as chemical or ion etching, and these techniques etch silicon dioxide, but do not etch polysilicon an appreciable amount. Since these etching techniques form generally vertical apertures, for the aperture to pass alongside legs 32 and yet expose the upper surface of bottom plates 24, the bottom plates 24 must project laterally beyond the legs 32 a distance sufficient to accommodate the apertures.

A 1.0 micron thick layer of aluminum is deposited on passivation layer 50 using conventional sputtering techniques. As shown in FIG. 4, in the process, some of the deposited aluminum is deposited in the apertures to form the plate connectors 54. The aluminum is then patterned and etched to form the top plates 28, each of which is integral with a respective plate connector 54. The etching creates gaps between adjacent top plates 28. A final layer of 3.5 micron thick silicon dioxide is deposited on the top plates 28 and into the gaps between the top plates 28 to form the final passivation layer 52. The final passivation layer 52 electrically insulates adjacent top plates 28 from each other and electrically insulates and mechanically protects the underlying structure.

The embodiment of FIGS. 1-4 provides the optimal linearity where the voltage across the resistor 10 is a single polarity and the front end 18 of the resistor 10 is at a greater potential than the back end 20. However, it is desirable to use a modified embodiment as shown in FIG. 5 to provide the optimal linearity where the voltage applied across the resistor 10 varies in polarity.

Figure 5:
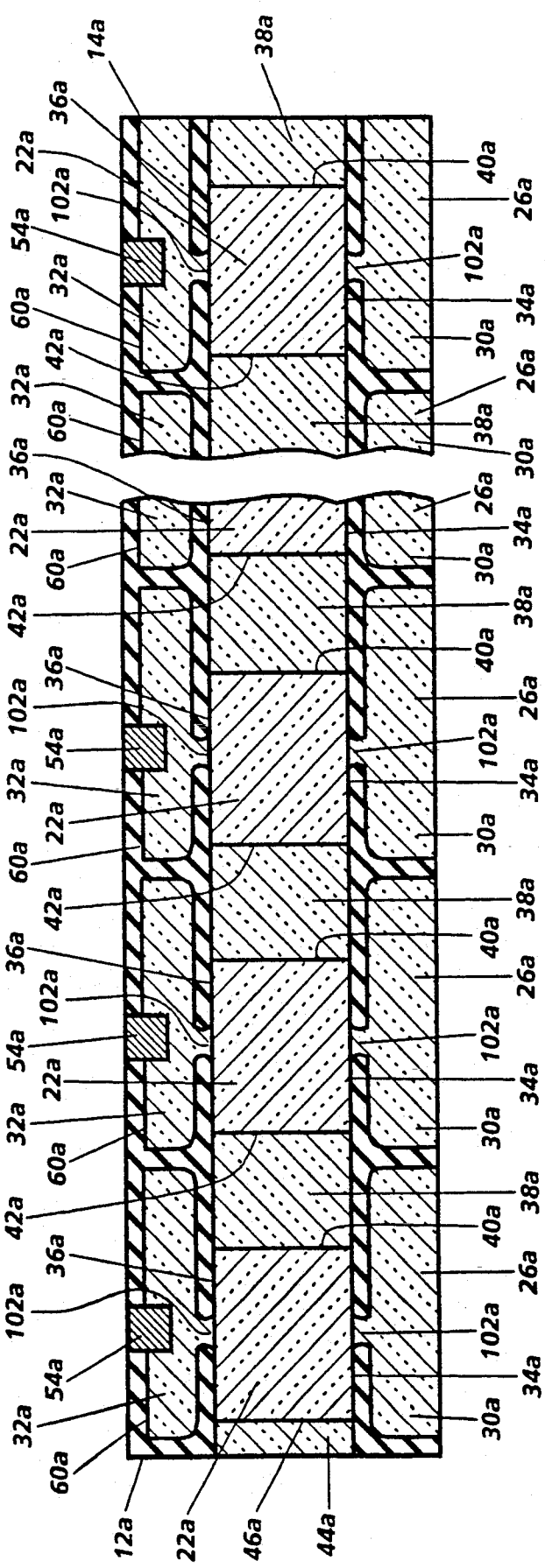
FIG. 5 is a view similar to FIG. 2 of a modification of the thin film integrated circuit resistor embodiment of FIGS. 1-4.

Referring to FIG. 5, the embodiment shown is constructed substantially the same as that in FIGS. 1-4, and all elements which are the same as the embodiment in FIGS. 1-4 are designated by the same reference numeral, only with an "a" affixed thereto. In the embodiment of FIG. 5, each middle plate 26a of each shield is electrically connected at the midpoint 102 of its associated resistive block 22a rather than at its rear end 40a (so employed in the embodiment of FIGS. 1-4), so that the potential of each shield is the potential of the midpoint of the potential difference between ends of its resistive block 22a, rather than the potential at its rear end 40a.

In the two preferred embodiments, the resistive blocks 22 and 22a and their associated shields are arranged in proximity, end to end. This arrangement of shields and their associated resistive blocks 22 and 22a is used because it is easy to lay out, it closely spaces the shields to improve their blocking of the substrate bias voltage electric fields, and it minimizes the area of the major surface 18 occupied by the resistor 10. Of course, other arrangements could be employed by one skilled in the art to implement the principles of this invention.

What is claimed is:

1. An integrated circuit resistor capable of remaining substantially linear over a large range of applied voltages, comprising:
   a. a substrate;
   b. passivation layer means;
   c. thin film resistance means;
   d. shield means; and
   e. said substrate, said passivation layer means, said resistance means and said shield means being arranged relative to each other in such a manner and said resistance means and said shield means being electrically connected in such a manner to maintain said resistance means substantially linear over a large range of applied voltages, wherein:
   said resistance means includes at least two resistive blocks which are electrically connected in series, said shield means includes at least two shields, one for each resistive block, and each of said shields is electrically connected to its associated resistive block,
   each shield includes a first conductive layer means, a second conductive layer means, and a third conductive layer means, said first conductive layer means being positioned between said substrate and said second conductive layer means, and said second conductive layer means being positioned between said first conductive layer means and said third conductive layer means,
   said passivation layer means includes a first passivation layer, a second passivation layer, and a third passivation layer, said first passivation layer being positioned between and in contact with said substrate and each of said first conductive layer means, said said second passivation layer being positioned between and in contact with said first conductive layer means and said second conductive layer means, and said third passivation layer being positioned between and in contact with said second conductive layer means and said third conductive layer means,
   and each of said resistive blocks being coplanar with its associated shield second conductive layer means and located between and in contact with said second and third passivation layers.

2. The integrated circuit resistor as defined in claim 1, wherein each shield is electrically connected to its associated resistive block such that the potential of a shield is substantially one of the potentials along the length of its associated resistive block.

3. The integrated circuit resistor as defined in claim 1, wherein the potential of each shield is substantially the potential of its associated resistive block at the midpoint of the potential difference between the ends of said resistive block.

4. The integrated circuit resistor as defined in claim 1, wherein the potential of each shield is substantially the potential of its associated resistive block at one end of said resistive block.

* * * * *